United States Patent
Fujimori et al.

(10) Patent No.: US 9,553,695 B2
(45) Date of Patent: Jan. 24, 2017

(54) LIKELIHOOD GENERATION CIRCUIT AND LIKELIHOOD GENERATION METHOD

(71) Applicant: MITSUBISHI ELECTRIC CORPORATION, Chiyoda-ku (JP)

(72) Inventors: Takafumi Fujimori, Chiyoda-ku (JP); Takashi Sugihara, Chiyoda-ku (JP)

(73) Assignee: MITSUBISHI ELECTRIC CORPORATION, Chiyoda-ku (JP)

( * ) Notice: Subject to any disclaimer, the term of this patent is extended or adjusted under 35 U.S.C. 154(b) by 0 days.

(21) Appl. No.: 15/021,862

(22) PCT Filed: Oct. 18, 2013

(86) PCT No.: PCT/JP2013/078321
§ 371 (c)(1),
(2) Date: Mar. 14, 2016

(87) PCT Pub. No.: WO2015/056342
PCT Pub. Date: Apr. 23, 2015

(65) Prior Publication Data
US 2016/0233982 A1 Aug. 11, 2016

(51) Int. Cl.
*H04L 1/00* (2006.01)
*H04L 27/38* (2006.01)
*H03M 13/45* (2006.01)

(52) U.S. Cl.
CPC ............. *H04L 1/0054* (2013.01); *H04L 27/38* (2013.01); *H03M 13/45* (2013.01)

(58) Field of Classification Search
CPC ................ H04L 1/0054; H04L 1/0009; H04L 25/03019; H04L 27/38; H04L 2025/0342; H04L 27/2082; H04L 27/3483; H04B 10/532

(Continued)

(56) References Cited

U.S. PATENT DOCUMENTS 7,239,668 B2 * 7/2007 De Gaudenzi ...... H04L 27/3411
375/265
8,774,320 B2 * 7/2014 Sun ...................... H04B 10/611
375/324

(Continued)

FOREIGN PATENT DOCUMENTS

EP    1 936 904 A1    6/2008
WO   WO 2008/038749 A1    4/2008
WO   WO 2012/070369 A1    5/2012

OTHER PUBLICATIONS

The Impact of the Combined 8-QAM and QPSK Subcarrier Modulation for Coherent Optical OFDM; Hidenori Takahashi, Itsuro Morita, and Hideaki Tanaka; Optical Fiber Communication Conference/National Fiber Optic Engineers Conference 2011.*

(Continued)

*Primary Examiner* — Emmanuel Bayard
(74) *Attorney, Agent, or Firm* — Oblon, McClelland, Maier & Neustadt, L.L.P.

(57) ABSTRACT

A phase of a symbol on an inner or outer circle of a received 8QAM symbol set, which is bitmapped by being assigned one bit depending on whether the symbol is on the inner or outer circle of a constellation mapping diagram and two bits for each of the quadrants, is rotated to generate, by QPSK likelihood generation, along with a likelihood of a received QPSK modulation symbol, a likelihood for the two bits assigned to the quadrant of the 8QAM modulated symbol set whose phase is rotated. Further, the phase-rotated 8QAM modulated symbol set is phase-rotated to the first quadrant of the diagram to move the symbol set to the QPSK symbol mapping positions, thereby generating, by QPSK likelihood generation, the likelihood for the one bit assigned to represent whether the symbol is on the outer circle or the inner circle of the 8QAM modulated symbol set.

13 Claims, 7 Drawing Sheets

(58) Field of Classification Search
USPC .................................. 375/329–332, 340–341
See application file for complete search history.

(56) References Cited

U.S. PATENT DOCUMENTS

| | | | |
|---|---|---|---|
| 8,798,480 B2* | 8/2014 | Huang | H04B 10/541 |
| | | | 398/183 |
| 2008/0123788 A1* | 5/2008 | Wongwirawat | H03G 3/3052 |
| | | | 375/348 |
| 2008/0279307 A1* | 11/2008 | Gaffney | H04L 27/3416 |
| | | | 375/298 |
| 2010/0150268 A1 | 6/2010 | Sasaki | |
| 2011/0312290 A1* | 12/2011 | Beeler | H04B 7/18513 |
| | | | 455/114.3 |
| 2013/0205184 A1 | 8/2013 | Nishimoto et al. | |

OTHER PUBLICATIONS

Generic Modulation Adaptive LINC Transmitter;T. Brabetz ; V. F. Fusco;Published in: Microwave Conference, 2002. 32nd European.*

International Search Report issued Nov. 12, 2013, in PCT/JP2013/078321 filed Oct. 18, 2013.

Park, J.W. et al., "Low Complexity Soft-Decision Demapper for High Order Modulation of DVB-S2 System",International SOC Design Conference, (2008), pp. I1-37-I1-40.

\* cited by examiner

US 9,553,695 B2

LIKELIHOOD GENERATION CIRCUIT AND LIKELIHOOD GENERATION METHOD

TECHNICAL FIELD

The present invention relates to a likelihood generation circuit, and the like, which are required for soft decision error correction decoding.

BACKGROUND ART

A likelihood used for soft decision error correction decoding is generally obtained by acquiring the minimum value of errors (Euclidean distances) between all symbol candidate points of a pattern presenting a transmitted bit of 1 and a received symbol, and the minimum value of errors between all symbol candidate points of a pattern presenting a transmitted bit of 0 and a received symbol, and converting a difference therebetween into a log likelihood ratio (LLR).

Calculation of the error (Euclidean distance) requires multiplications, and then, the minimum value needs to be selected from the plurality of candidates, resulting in an increase in a circuit scale. Further, if a circuit operating in real time is constructed, the real time property is secured by implementing likelihood generation circuits in parallel, resulting in such a problem that the number of multipliers increases as the number of parallelisms increases, which leads to an increase in the circuit scale of the likelihood generation circuit.

In contrast, for example, in Patent Literature 1, there is proposed a soft decision value generation circuit that reduces the circuit scale from the relationship of the symbol mapping by eliminating, in advance, an unnecessary calculation portion for the Euclidean distances to the symbols based on the relationship between the received signal and the mapping.

CITATION LIST

Patent Literature

[PTL 1] WO 2012/070369 A1

SUMMARY OF INVENTION

Technical Problem

In the related-art circuit, the circuit is reduced by removing the unnecessary calculation portion clarified by equation expansion. However, in a case of communication by adaptive modulation that changes the modulation scheme depending on a communication state, it is necessary to adapt to a plurality of modulation schemes, and if the plurality of modulation schemes are supported, a likelihood generation circuit or an extended likelihood generation circuit needs to be implemented for each of the modulation schemes, resulting in such a problem that the circuit scale increases in proportion to the number of supported modulation schemes.

The present invention has been made to solve the above-mentioned problem, and therefore has an object to provide a likelihood generation circuit and the like that reduce an increasing circuit scale of a likelihood generation part for a soft decision value generation circuit supporting a plurality of modulation schemes, particularly the quadrature amplitude modulation (8QAM) and the quadrature phase shift keying (QPSK), by sharing a part of the likelihood generation part.

Solution to Problem

According to one embodiment of the present invention, there are provided a likelihood generation circuit and the like for generating a likelihood from received data modulated by modulation schemes, QPSK and 8QAM, including: a phase rotation adjustment part for rotating a phase of symbols on an inner circle or an outer circle of a symbol set of the received data modulated by the modulation scheme, 8QAM, and bitmapped by being assigned one bit for selecting the inner circle or the outer circle of a constellation mapping diagram and two bits representing each quadrant thereof; a first likelihood generation part for generating, by QPSK likelihood generation, a likelihood of the received symbol of the received data modulated by the modulation scheme, QPSK, and a likelihood for the two bits representing quadrants of the symbol set modulated by the modulation scheme, 8QAM, and processed by the phase rotation adjustment part; a phase rotation part for rotating phases of the symbol set modulated by the modulation scheme, 8QAM, and processed by the phase rotation adjustment part to a first quadrant of the constellation mapping diagram; and a second likelihood generation part for applying likelihood generation by the modulation scheme, QPSK, or directly calculating a likelihood by threshold determination from the symbol set modulated by the modulation scheme, 8QAM, and processed by the phase rotation part, to thereby generate the likelihood for the bit representing whether the received symbol is on the inner circle or the outer circle of the symbol set modulated by the modulation scheme, 8QAM.

Advantageous Effects of Invention

According to the present invention, in the likelihood generation circuit supporting the data modulated by the modulation schemes, 8QAM and QPSK, the circuit scale can be reduced by sharing a part of the likelihood generation part.

DESCRIPTION OF EMBODIMENTS

In the present invention, in a likelihood generation circuit whose circuit scale increases if a plurality of modulation schemes, particularly 8QAM and QPSK, are supported, the circuit scale is reduced by sharing a part of a likelihood generation part. In order to share the part of the likelihood generation part, the likelihood generation circuit includes a phase rotation part for adjusting a phase rotation depending on the modulation scheme, a likelihood generation part, and a modulation scheme selection part. As a result, while a circuit for 8QAM and a circuit for QPSK can have a shared part, the circuit scale can be reduced.

Figure 7:
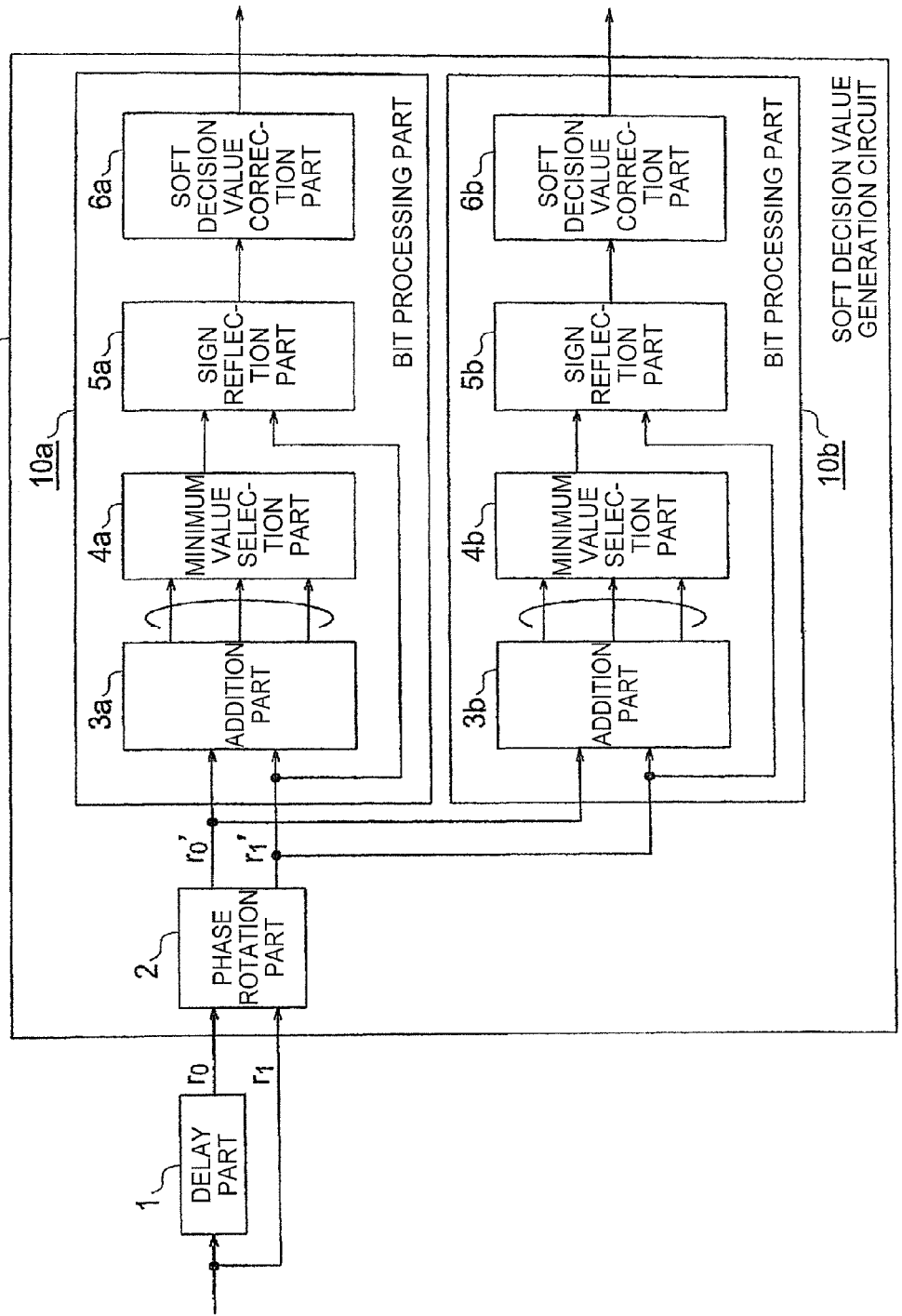
FIG. 7 is a diagram for illustrating a related-art soft decision value generation circuit.

Before a description of the likelihood generation circuit according to the present invention, the related-art soft decision value generation circuit is illustrated in FIG. 7, and a little more description thereof is given. In FIG. 7, a delay part 1 delays a received signal. In a soft decision value generation circuit 20, a phase rotation part 2 rotates the phase of the received signal such that, to two inputs including a delayed signal r0 set as a reference signal for differential decoding and a non-delayed signal r1, the same amount of a phase rotation as that of the signal r0 is applied, to thereby respectively output signals r0' and r1'. Moreover, in each of bit processing parts 10a and 10b in the soft decision value generation circuit 20 (corresponding to the likelihood generation circuit of the present invention), each of addition parts 3a and 3b calculates possible Euclidean distances for the output signals r0' and r1' of the phase rotation part 2. Each of minimum value selection parts 4a and 4b selects the minimum value of the Euclidean distances to possible symbols. Each of sign reflection parts 5a and 5b adds a sign depending on whether the input value is positive or negative. Each of soft decision value correction parts 6a and 6b selects a value of the LLR from the selected minimum Euclidean distance.

The phase rotation part 2 applies a rotation by 90 degrees as a unit to each of the symbols. The rotation processing by 90 degrees as a unit can be realized by inverting the sign and switching the I-ch (real part) and the Q-ch (imaginary part) with each other, and a small circuit scale can thus be realized. The addition parts 3a and 3b are circuits for addition, and are circuits smaller in scale than the multiplication circuits. Each of the minimum value selection parts 4a and 4b is a circuit for selecting the minimum value from three values, and is a small-scale circuit realized by using two comparators.

Each of the sign reflection parts 5a and 5b simply reflects the sign depending on the sign of the signal r1', and is a small-scale circuit. Each of the soft decision value correction parts 6a and 6b carries out a fixed value multiplication, which can be realized by a bit shift and an adder or reference to a table by using a reference table, and does not greatly affect the increase in the circuit scale. On this occasion, the related art clarifies from equation expansion that a selection from three candidate values in the minimum value selection parts 4a and 4b is sufficient, and the soft decision value correction parts 6a and 6b only need to handle the fixed value multiplication. Based on this fact, the related art realizes the reduction in the circuit scale.

However, if a plurality of modulation schemes are supported, the likelihood generation circuit or the extended likelihood generation circuit needs to be implemented for each of the modulation schemes, and the circuit scale thus increases depending on the number of supported modulation schemes.

Now, a likelihood generation circuit and the like according to each of embodiments of the present invention are described with reference to the drawings. Note that, in each of the embodiments, the same or corresponding portions are denoted by the same reference symbols, and the overlapping description thereof is omitted.

First Embodiment

Figure 1:
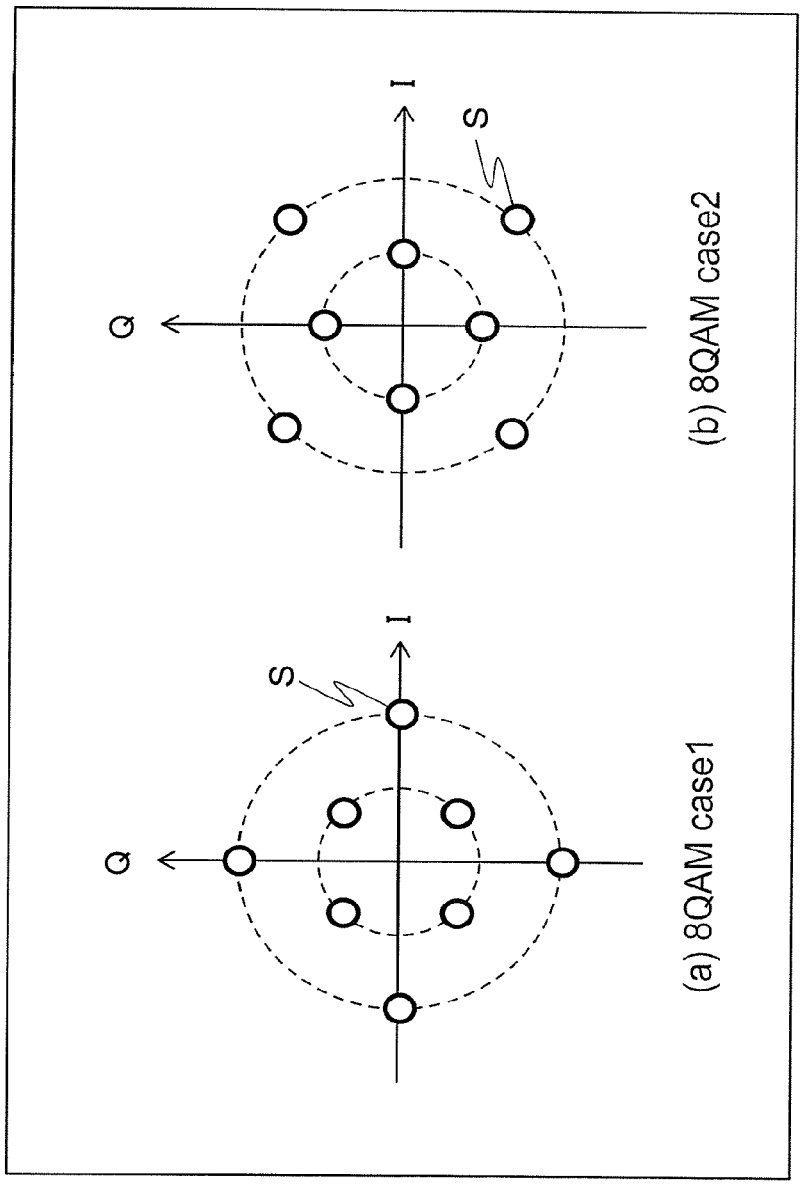
FIG. 1 is a diagram for illustrating an example of a constellation mapping diagram (mapping) of a modulation scheme, 8QAM, supported by the present invention.

First, FIG. 1 is a diagram for illustrating an example of a constellation mapping diagram of a modulation scheme, 8QAM, supported by the present invention. In FIG. 1, S represents each symbol point (candidate point of a received symbol) of a symbol set in 8QAM mapping, and four symbols are mapped both on an inner circle and an outer circle depending on lengths of the amplitudes of the symbols. A symbol mapping scheme for 8QAM is a star-type mapping, and for the same star-type mappings as illustrated in part (a) and part (b) of FIG. 1, mappings (8QAM case1 and 8QAM case2) rotated by 45 degrees from each other are conceivable. In the mapping of 8QAM, one symbol is constructed by three bits, and the three bits can be considered to be separated into one bit representing whether the symbol is on the inner circle or on the outer circle, and two bits representing a phase of each of the four symbols mapped on the inner and outer circles. On this occasion, the determination of the inner circle or the outer circle and the position of the phase may be assigned to arbitrary bits among the three bits assigned to one symbol. In this specification, without loss of generality, the determination bit for the inner or outer circle is assigned to the most significant bit, and the phase is assigned to the lower two bits. Moreover, according to the present invention, any one of the mappings of part (a) and part (b) of FIG. 1 can be used by changing the direction of the rotation processing in the phase rotation part. The mapping of part (a) of FIG. 1 can be used by rotating the symbol set on the outer circle by ±45 degrees, and the mapping of part (b) of FIG. 1 can be used by rotating the symbol set on the inner circle by ±45 degrees. For both the mappings of part (a) and part (b) of FIG. 1, the rotation is carried out in such a direction that the lower two bits on the outer circle and the lower two bits on the inner circle are in the same quadrangle. As described above, only by changing the inner circle and the outer circle to be rotated and the rotational direction thereof, both the mappings in part (a) and part (b) of FIG. 1 can be used in the same manner, and hence, as an overview of the present invention, a description is focused on such a case that the rotational direction of the inner circle is −45 degrees for the mapping of part (b) of FIG. 1.

Figure 2:
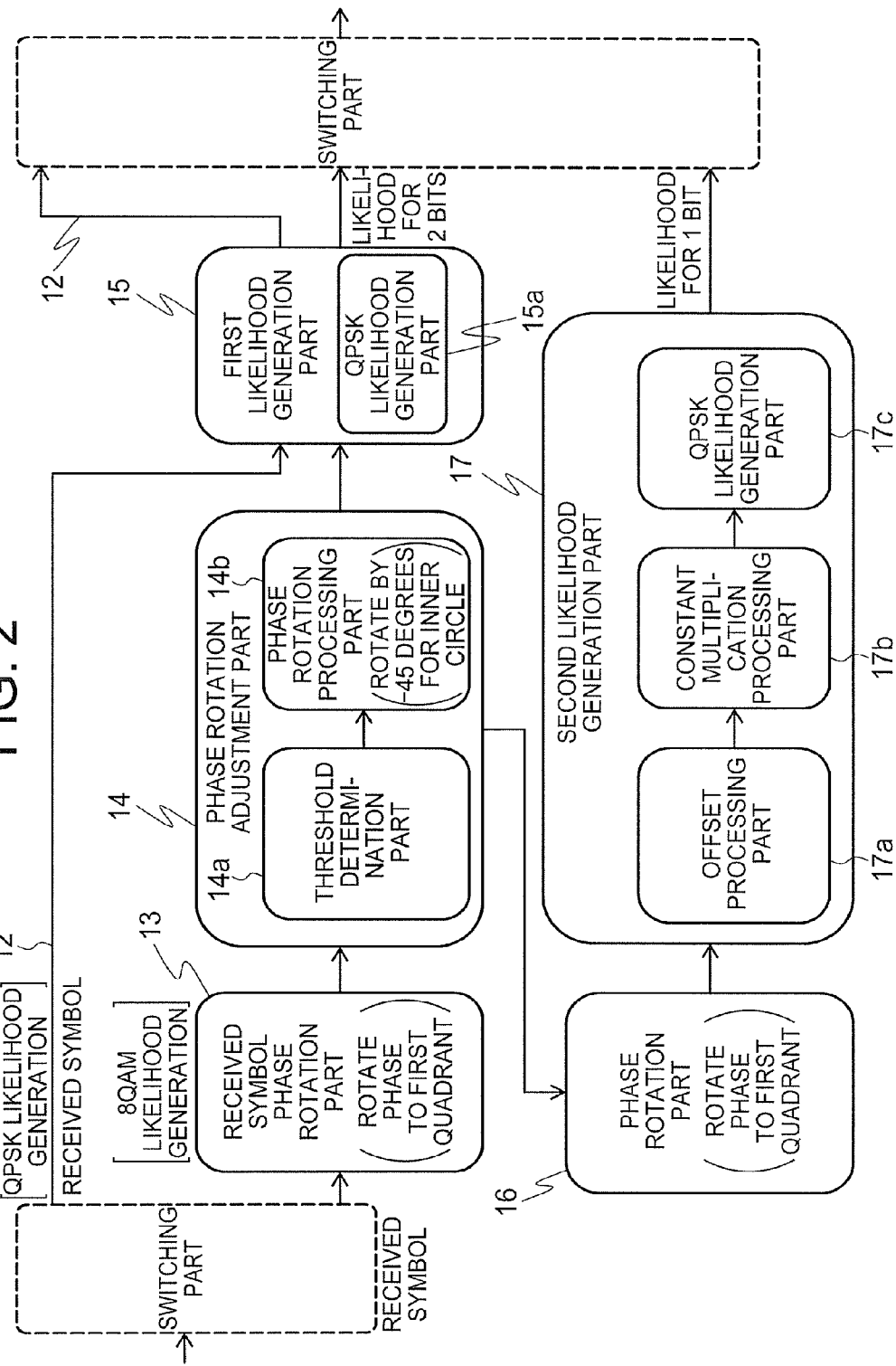
FIG. 2 is a diagram for illustrating a schematic configuration of a likelihood generation circuit according to a first embodiment of the present invention.

FIG. 2 is a diagram for illustrating a schematic configuration of a likelihood generation circuit according to a first embodiment of the present invention. A path 12 represents a path when a QPSK likelihood generation scheme for the modulation scheme, QPSK, is selected. The other paths represent paths when an 8QAM likelihood generation scheme is selected. A received symbol of received data modulated by the modulation scheme, QPSK, is input to the path 12, and a received symbol of received data modulated by the modulation scheme, 8QAM, is input to a received symbol phase rotation part 13.

The received symbol phase rotation part 13 rotates the input symbol to the first quadrant for subsequent processing. A phase rotation adjustment part 14 determines whether a symbol is on the inner circle or on the outer circle. In the phase rotation adjustment part 14, a threshold determination part 14a carries out amplitude determination for a symbol based on a threshold. A phase rotation processing part 14b rotates a symbol determined to be on the inner circle by −45 degrees. Note that, the data rotated by −45 degrees is an input symbol, that is, data before the processing by the received symbol phase rotation part 13 and the threshold determination part 14a.

A first likelihood generation part (first QPSK likelihood generation part 15a) 15 carries out the likelihood generation for QPSK, and is a shared circuit part between the QPSK likelihood generation part and the 8QAM likelihood generation part. The first likelihood generation part 15 generates and outputs a likelihood for the two bits. On this occasion, the QPSK likelihood generation part 15a may have any circuit configuration as long as the circuit configuration generates the likelihood of QPSK. In other words, as described above, the scheme of acquiring the minimum value of the errors (Euclidean distances) from all symbol candidate points (refer to part (b) of FIG. 1) of a pattern presenting a transmitted bit of 1 for a received symbol and the minimum value of errors from all symbol candidate points of a pattern presenting a transmitted bit of 0, and, based on the log likelihood ratio (LLR) of the difference therebetween, generating the likelihood for the two bits may be used, or the scheme of Patent Literature 1 may be used. The likelihood for the two bits, which is the output of this QPSK likelihood generation part 15a, is the likelihood of the received symbol modulated by QPSK, or is the likelihood for the lower two bits out of the three bits for the received symbol modulated by 8QAM.

A phase rotation part 16 rotates the data (symbol) whose phase has been rotated by −45 degrees to the first quadrant. A second likelihood generation part 17 generates the likelihood for the most significant one bit out of the three bits for the received symbol modulated by 8QAM. The second likelihood generation part 17 includes an offset processing part 17a, a constant multiplication processing part 17b, and a QPSK likelihood generation part (second QPSK likelihood generation part) 17c. The second likelihood generation part 17 outputs a likelihood for one bit out of likelihoods for two bits output from the QPSK likelihood generation part 17c, and thus the likelihood for the one bit is combined with the likelihood for the lower two bits for 8QAM output from the first likelihood generation part 15, to thereby form a circuit for outputting the likelihood for the three bits for 8QAM.

Note that, in order to switch the likelihood generation depending on the modulation scheme, an input or output switching part (represented by broken lines) for switching between the QPSK likelihood generation and the 8QAM likelihood generation for an input signal depending on a switching signal fed from the outside is provided, for example, on at least one of an input side for the received symbol on the left side of FIG. 2 and an output side for the likelihood on the right side as a modulation scheme selection part. Moreover, the received symbol phase rotation part 13, the phase rotation adjustment part 14, and the phase rotation part 16 construct a phase rotation part, and the first and second likelihood generation parts 15 and 17 construct a likelihood generation part.

Figure 3:
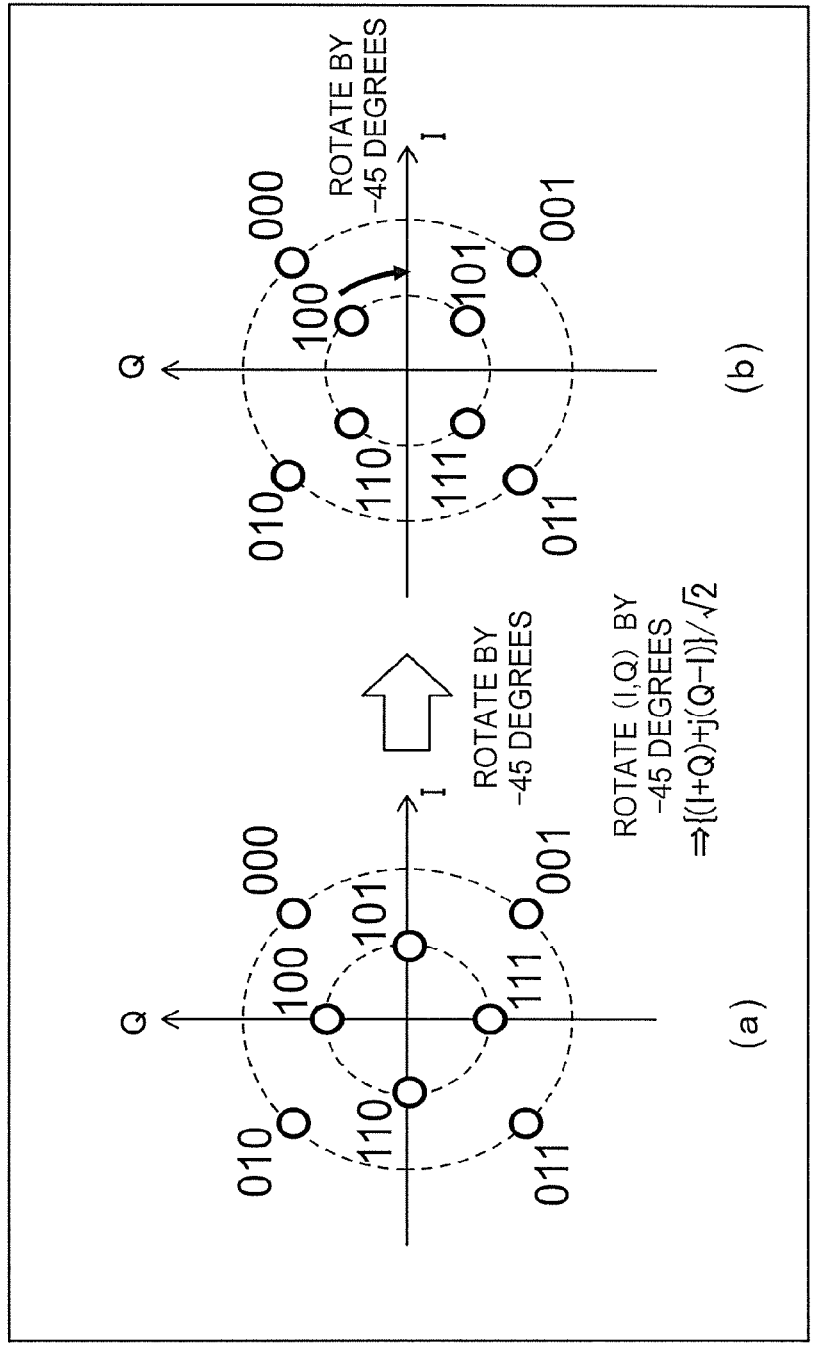
FIG. 3 is a diagram for illustrating likelihood generation processing for 8QAM out of processing carried out by the likelihood generation circuit of FIG. 2.
Figure 4:
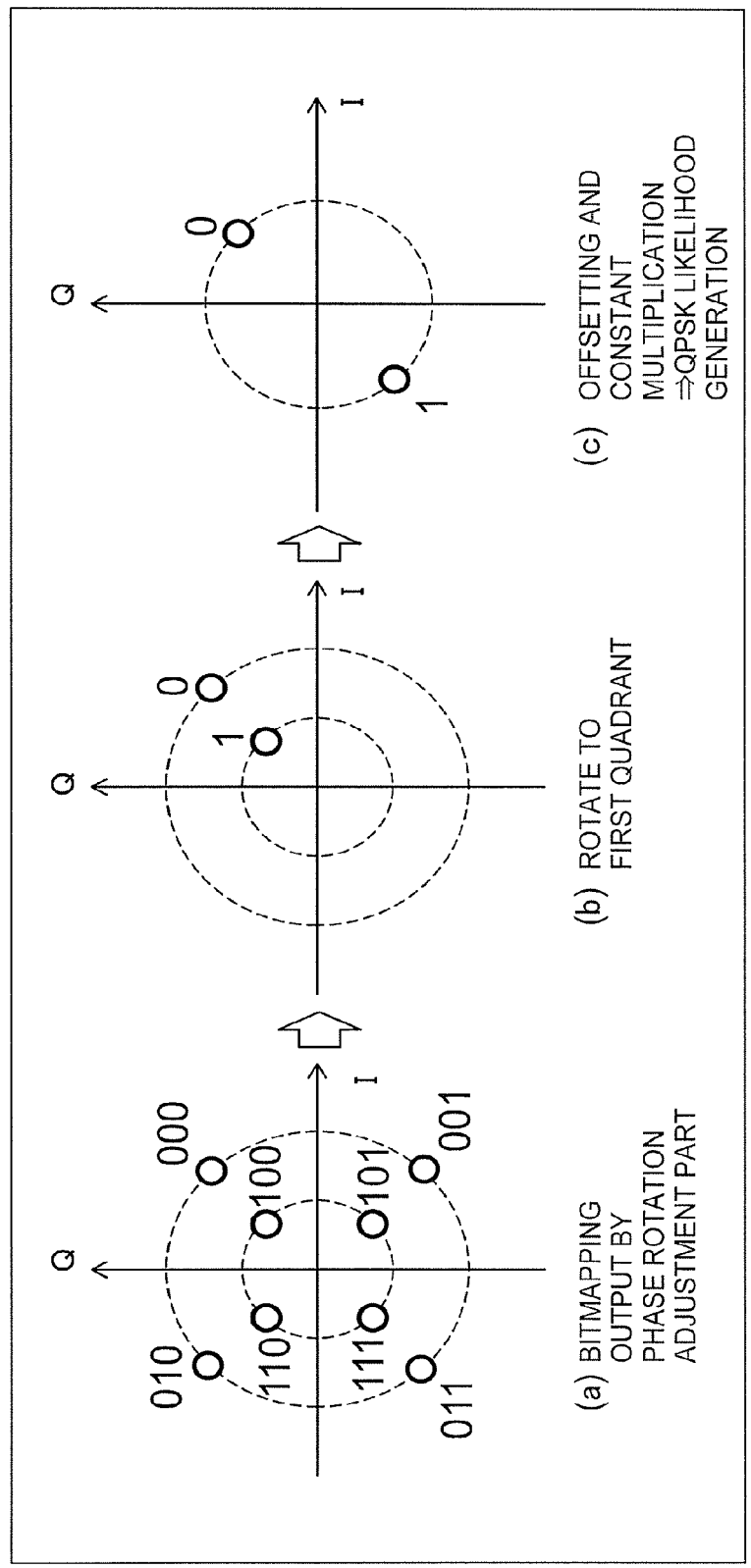
FIG. 4 is a diagram for illustrating likelihood generation processing for 8QAM out of processing carried out by the likelihood generation circuit of FIG. 2.

FIG. 3 and FIG. 4 are diagrams illustrating likelihood generation processing for 8QAM out of processing carried out by the likelihood generation circuit of FIG. 2. FIG. 3 is a diagram for illustrating a bitmapping example for the symbol mapping for the symbol set of part (b) of FIG. 1. In this example, the most significant bit is a bit representing whether the symbol is on the inner circle or the outer circle, and the mapping is configured such that the outer circle corresponds to "0", and the inner circle corresponds to "1". Moreover, the lower two bits assign "00" to the symbols in the first quadrant on the outer circle, "10" to the second quadrant, "11" to the third quadrant, and "01" to the fourth quadrant, and the same bitmapping is applied to the symbols at positions on the inner circle obtained by rotating the outer circle by 45 degrees (counterclockwise).

A description is now given of the likelihood generation method for the lower two bits for 8QAM by the bitmapping of FIG. 3 as an example. First, the phase of the data (input symbol) is rotated by the received symbol phase rotation part 13 of FIG. 2 to the first quadrant. The threshold determination part 14a determines whether the symbol is on the inner circle or the outer circle based on the threshold. On this occasion, any one of an amplitude and position information on the I/Q axis may be used as a determination axis. On this occasion, the received symbol phase rotation part 13 carries out the processing of the determination only in the first quadrant, but, depending on the circuit scale, the circuit may be configured to determine whether the amplitude corresponds to the inner circle or the outer circle without the phase rotation to the first quadrant. In other words, the received symbol phase rotation part 13 can be omitted. After the determination of whether the symbol is on the inner circle or on the outer circle, when the symbol is on the inner circle, the phase rotation processing part 14b applies processing of rotating the symbol by −45 degrees (rotating by 45 degrees clockwise about the origin of the intersection of the I axis and the Q axis in the constellation mapping diagram), to thereby rotate the symbol mapped on the I/Q axes into the quadrant.

In this bitmapping example, the inner circle is rotated by −45 degrees from the state of part (a) of FIG. 3 to the state of part (b) of FIG. 3 so that the lower two bits in each quadrant are the same for the symbols on the inner and outer circles, and processing equivalent to that for QPSK can now be applied. Therefore, after the application of the processing in the received symbol phase rotation part 13 and the phase rotation adjustment part 14, and the subsequent passage through the first likelihood generation part 15, which is the likelihood generation circuit for QPSK, the first likelihood generation part 15 can output the likelihood for the lower two bits for 8QAM. Moreover, only the lower two bits are assigned in the quadrant direction, and hence the same differential coding and decoding as those for QPSK can also be applied.

This example is a bitmapping required for implementing the circuit according to the present invention, but the assignment rule itself for the bits may be different. The policy is that one bit (such as the most significant bit) out of the three bits for 8QAM is assigned depending on whether the symbol is on the inner circle or the outer circle. The remaining two bits (such as the lower two bits) are assigned to one of the neighboring symbols when the bit mapping assigned to the outer circle is rotated by ±45 degrees. Keeping the above-mentioned rule enables the application of the configuration for the likelihood generation without a change. Note that, when such bitmapping that the symbol on the outer circle and the symbol rotated by −45 degrees have the same lower two bits is used, the same configuration can be used by a rotation of 45 degrees by the phase rotation processing part 14b. Moreover, for the mapping of part (a) of FIG. 1, the law of the bitmapping is the same, and this law can be applied to the mapping of part (a) of FIG. 1 by rotating the symbols on the outer circle.

Then, the likelihood for the remaining one bit is generated. FIG. 4 is an illustration of processing starting from the output from the phase rotation adjustment part 14 of FIG. 2. Part (a) of FIG. 4 is an illustration of the symbol mapping of the output of the phase rotation adjustment part 14 (phase rotation processing part 14b), and part (b) of FIG. 4 is an illustration of the symbol mapping when the phase of the symbol mapping of part (a) of FIG. 4 is rotated by the phase rotation part 16 of FIG. 2 to the first quadrant. On this occasion, the likelihood for the lower two bits is generated by the first likelihood generation part 15 of FIG. 2, and only the upper one bit is illustrated.

Then, the second likelihood generation part 17 of FIG. 2 generates the likelihood for the remaining one bit, and part (c) of FIG. 4 is an illustration of a calculation method for the likelihood performed by the second likelihood generation part 17. In the offset processing of the offset processing part 17a of the second likelihood generation part 17, processing of moving a middle point between the two symbols mapped to the first quadrant to the origin is carried out. The constant multiplication processing part 17b applies constant multiplication to the two symbols after the middle point has been moved to the origin. This processing is processing for applying the QPSK likelihood generation processing. The symbol mapping is adjusted by the offset and constant multiplication processing to a range in which the likelihood can be generated by the QPSK likelihood generation part 17c, and thus, the QPSK likelihood generation part can be shared to generate the likelihood for the one bit. On this occasion, the QPSK likelihood generation part 17c outputs the likelihoods for the two bits, and, in the mapping of FIG. 3, the same result is provided by outputting any one of the likelihoods for the I/Q components, and hence any one of the likelihoods can be output. Moreover, the precision of the likelihood can be increased by likelihood addition.

As described above, the likelihood generation circuit shared between the 8QAM and QPSK can be provided, and the problem of the increase in the circuit scale caused by implementing the likelihood generation circuits as many as the number of the modulation schemes can be solved.

Second Embodiment

Figure 5:
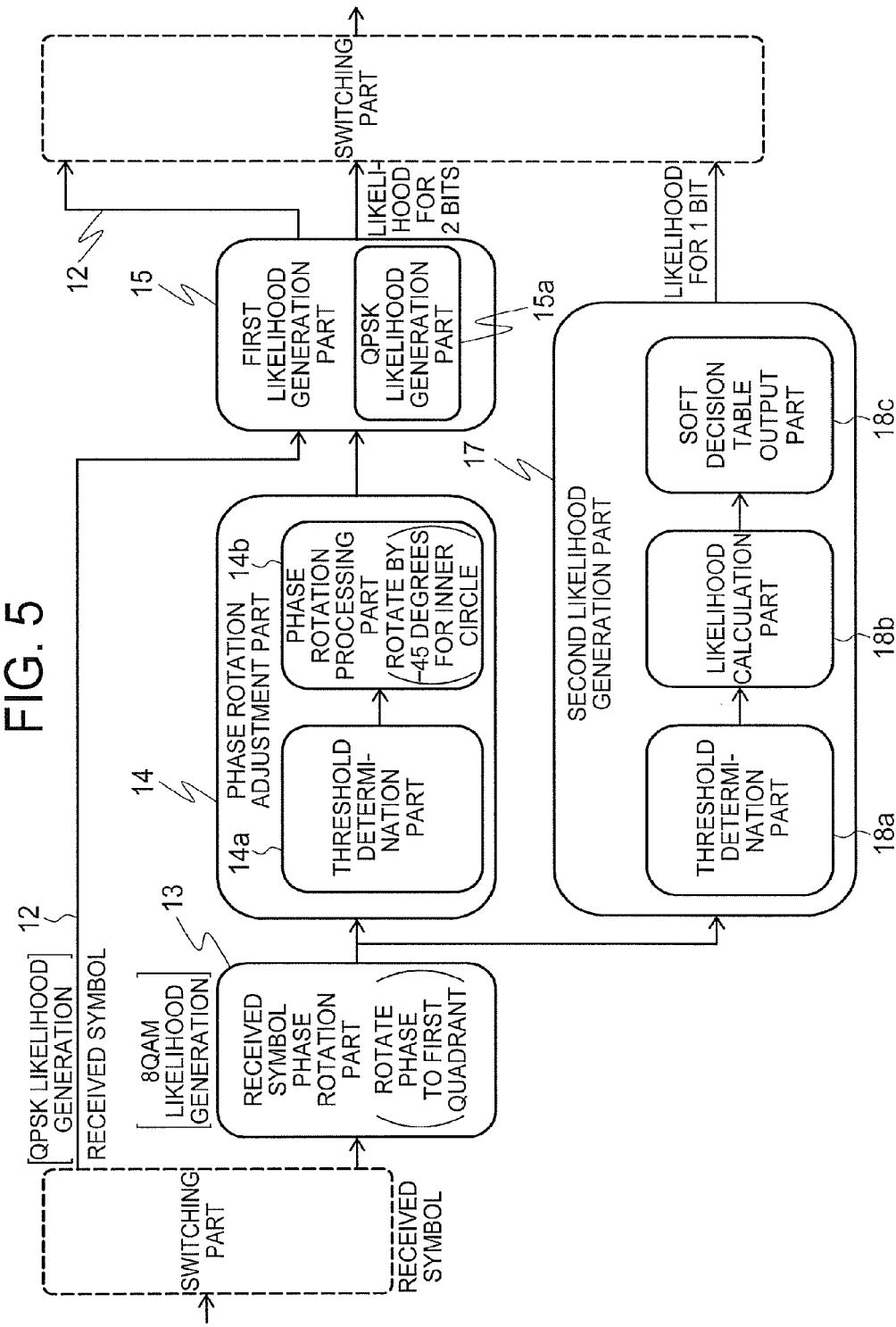
FIG. 5 is a diagram for illustrating a schematic configuration of a likelihood generation circuit according to a second embodiment of the present invention.

FIG. 5 is a diagram for illustrating a schematic configuration of a likelihood generation circuit according to a second embodiment of the present invention. FIG. 5 is an illustration of the likelihood generation circuit for 8QAM for carrying out another generation method for the bitmapping for the upper one bit of FIG. 3 and FIG. 4. On this occasion, the processing up to the lower two bits is the same as that of FIG. 2, and the likelihood generation circuit can be similarly shared between QPSK and 8QAM. A second likelihood generation part 18 generates the likelihood for the remaining one bit. The second likelihood generation part 18 includes a (second) threshold determination part 18a, which is different from the (first) threshold determination part 14a, a likelihood calculation part 18b, and a soft decision table output part 18c for providing a soft decision value that translates a calculation result by the likelihood calculation part 18b into a size to be output.

Note that, as in the above-mentioned embodiment, in order to switch the likelihood generation depending on the modulation scheme, an input or output switching part (represented by broken lines) is provided, for example, on at least one of an input side for the received symbol on the left side of FIG. 5 and an output side for the likelihood on the right side as a modulation scheme selection part. Moreover, the received symbol phase rotation part 13 and the phase rotation adjustment part 14 construct the phase rotation part, and the first and second likelihood generation parts 15 and 18 construct the likelihood generation part.

The second likelihood generation part 18 is a likelihood generation part for the one bit, and, as described above, the likelihood generation method for the lower two bits is the same as the above-mentioned method. A description is given of the likelihood generation method for the upper one bit.

Figure 6:
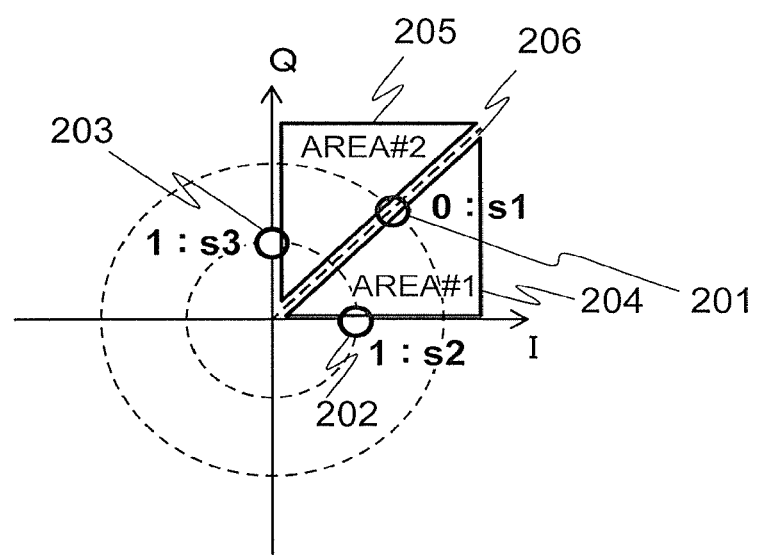
FIG. 6 is a diagram for illustrating likelihood generation processing for 8QAM out of processing carried out by the likelihood generation circuit of FIG. 5.

The (second) threshold determination part 18a makes a determination about an area of FIG. 6. On this occasion, the threshold determination by the threshold determination part 18a determines whether data (symbol) exists in a lower area #1 (204) or an upper area #2 (205) with respect to an axis 206, which corresponds to I=Q. The likelihood is calculated by acquiring a constant multiple of a difference between the smallest Euclidean distance out of Euclidean distances between the symbols having "1" in the bit subject to the calculation of the likelihood and the received data, and the smallest Euclidean distance out of Euclidean distances between the symbols having "0" in the bit subject to the calculation of the likelihood and the received data.

When data exists in the first quadrant, a symbol (0:s1) 201, a symbol (1:s2) 202, and a symbol (1:s3) 203 illustrated in FIG. 6 minimize the Euclidean distance for "1" or "0". The input to the second likelihood generation part 18 is the output of the received symbol phase rotation part 13, and the received data thus exists only in the first quadrant. On this occasion, for the case of the mapping example of FIG. 3, if the likelihood for the upper one bit is the calculation subject, the symbol (0:s1) 201 is a symbol giving the minimum Euclidean distance for "0", if the data exists in the area #1 (204), the symbol (1:s2) 202 is a symbol giving the minimum Euclidean distance for "1", if the data exists in the area #2 (205), the symbol (1:s3) 203 is a symbol giving the minimum Euclidean distance for "1", and the likelihood (log likelihood ratio, LLR) can be calculated as described below.

$$LLR=[1/(2\sigma^2)](|r-s2|^2-|r-s1|^2) \quad \text{area \#1}$$

$$LLR=[1/(2\sigma^2)](|r-s3|^2-|r-s1|^2) \quad \text{area \#2}$$

On this occasion, r denotes the received data, and $\sigma^2$ denotes a variance of Gaussian noise.

As a result, in the threshold determination part 18a, when the area is determined based on the threshold, the candidates for the symbol to be calculated are determined.

In the likelihood calculation part 18b, based on the result of the threshold determination, the Euclidean distances for the received data to the symbols (0:s1) 201, (1:s2) 202, and (1:s3) 203 are calculated, and the likelihood is calculated. For 8QAM, it is necessary that Euclidean distances between the eight symbol candidate points and the received data be calculated, the minimum Euclidean distance be selected, and the likelihood be calculated, but, in this configuration, the likelihood can be calculated only by calculating the two Euclidean distances, and the circuit can be reduced. Moreover, the mappings of the symbol (0:s1) 201, the symbol (1:s2) 202, and the symbol (1:s3) 203 are represented by fixed values, and hence the calculation of the Euclidean distance is represented only by bit shifts and an addition applied to the received data by expanding the above-mentioned equations, and a circuit can be produced without employing multiplication circuits.

The soft decision table output part 18c holds a table reflecting the constant multiplication processing in the likelihood calculation (table for translating the likelihood value acquired in the likelihood calculation part 18b into the resulting likelihood value as a result of the application of the constant multiplication processing), to thereby output the final likelihood value.

As described above, the calculation of the most significant bit of the likelihood of the received symbol modulated by 8QAM can be simplified by using the likelihood generation circuit for QPSK also as the circuit for acquiring the likelihood for the lower two bits of the received symbol modulated by 8QAM, and a configuration capable of providing a circuit reduction effect can be realized.

Note that, the likelihood generation circuit according to the present invention is constructed by a microprocessor, an FPGA, an ASIC, or the like.

INDUSTRIAL APPLICABILITY

The likelihood generation circuit and the likelihood generation method according to the present invention can be widely applied to receiver apparatus and the like in various fields.

REFERENCE SIGNS LIST 12 path, 13 received symbol phase rotation part, 14 phase rotation adjustment part, 14a (first) threshold determination part, 14b phase rotation processing part, 15 first likelihood generation part, 15a, 17c QPSK likelihood generation part, 16 phase rotation part, 17 second likelihood generation part, 17a offset processing part, 17b constant multiplication processing part, 18 second likelihood generation part, 18a (second) threshold determination part, 18b likelihood calculation part, 18c soft decision table output part.

The invention claimed is:

1. A likelihood generation circuit for generating a likelihood of a received symbol of received data modulated by modulation schemes, QPSK and 8QAM, comprising:
   a phase rotation adjustment part for rotating a phase of a symbol on an inner circle or an outer circle of a symbol set of the received data modulated by the modulation scheme, 8QAM, and bitmapped by being assigned one bit for selecting the inner circle or the outer circle of a constellation mapping diagram and two bits representing each quadrant thereof;
   a first likelihood generation part for generating, by QPSK likelihood generation, a likelihood of the received symbol of the received data modulated by the modulation scheme, QPSK, and a likelihood for the two bits representing quadrants of the symbol set modulated by the modulation scheme, 8QAM, and processed by the phase rotation adjustment part;
   a phase rotation part for rotating phases of the symbol set modulated by the modulation scheme, 8QAM, and processed by the phase rotation adjustment part to a first quadrant of the constellation mapping diagram; and
   a second likelihood generation part for moving the symbol set modulated by the modulation scheme, 8QAM, and processed by the phase rotation part to symbol mapping positions for the modulation scheme, QPSK, to thereby generate, by the QPSK likelihood generation, a likelihood for the bit representing whether the received symbol is on the inner circle or the outer circle of the symbol set modulated by the modulation scheme, 8QAM.

2. The likelihood generation circuit according to claim 1, wherein the phase rotation adjustment part comprises:
   a threshold determination part for determining, by a comparison with a threshold, whether the symbol is a symbol on the inner circle or a symbol on the outer circle; and
   a phase rotation processing part for rotating a phase of a symbol on the inner circle by −45 degrees.

3. The likelihood generation circuit according to claim 1, wherein, in the second likelihood generation part, processing of offsetting and a constant multiplication is applied to the symbol set having the phases rotated to the first quadrant, and the likelihood for the bit representing whether the received symbol is on the inner circle or the outer circle of the symbol set modulated by the modulation scheme, 8QAM, is generated by the QPSK likelihood generation.

4. The likelihood generation circuit according to claim 1, further comprising a received symbol phase rotation part for rotating the phases of the symbol set of the received data modulated by the modulation scheme, 8QAM, to the first quadrant of the constellation mapping diagram,
   wherein the phase rotation adjustment part rotates the phases of the symbol set processed by the received symbol phase rotation part.

5. The likelihood generation circuit according to claim 2, wherein, in the second likelihood generation part, processing of offsetting and a constant multiplication is applied to the symbol set having the phases rotated to the first quadrant, and the likelihood for the bit representing whether the received symbol is on the inner circle or the outer circle of the symbol set modulated by the modulation scheme, 8QAM, is generated by the QPSK likelihood generation.

6. The likelihood generation circuit according to claim 2, further comprising a received symbol phase rotation part for rotating the phases of the symbol set of the received data modulated by the modulation scheme, 8QAM, to the first quadrant of the constellation mapping diagram,
   wherein the phase rotation adjustment part rotates the phases of the symbol set processed by the received symbol phase rotation part.

7. The likelihood generation circuit according to claim 3, further comprising a received symbol phase rotation part for rotating the phases of the symbol set of the received data modulated by the modulation scheme, 8QAM, to the first quadrant of the constellation mapping diagram,
   wherein the phase rotation adjustment part rotates the phases of the symbol set processed by the received symbol phase rotation part.

8. The likelihood generation circuit according to claim 5, further comprising a received symbol phase rotation part for rotating the phases of the symbol set of the received data modulated by the modulation scheme, 8QAM, to the first quadrant of the constellation mapping diagram,
   wherein the phase rotation adjustment part rotates the phases of the symbol set processed by the received symbol phase rotation part.

9. A likelihood generation circuit for generating a likelihood of a received symbol of received data modulated by modulation schemes, QPSK and 8QAM, comprising:
   a phase rotation adjustment part for rotating a phase of a symbol on an inner circle or an outer circle of a symbol set of the received data modulated by the modulation scheme, 8QAM, and bitmapped by being assigned one bit for selecting the inner circle or the outer circle of a constellation mapping diagram and two bits representing each quadrant thereof;
   a first likelihood generation part for generating, by QPSK likelihood generation, a likelihood of the received symbol of the received data modulated by the modulation scheme, QPSK, and a likelihood for the two bits representing quadrants of the symbol set modulated by the modulation scheme, 8QAM, and processed by the phase rotation adjustment part;
   a received symbol phase rotation part for rotating phases of the symbol set of the received data modulated by the modulation scheme, 8QAM, to the first quadrant of the constellation mapping diagram; and a second likelihood generation part for determining, based on positions of the respective symbols, candidate symbols for a likelihood calculation from among the symbol set modulated by the modulation scheme, 8QAM, and processed by the received symbol phase rotation part, and generating, based only on the candidate symbols, a likelihood for the bit representing whether the received symbol is on the inner circle or the outer circle of the symbol set of the data modulated by the modulation scheme, 8QAM.

10. The likelihood generation circuit according to claim 9, wherein, in the second likelihood generation part, the position of the symbol is determined based on a relationship between areas having an axis I=Q as a reference and the symbol.

11. The likelihood generation circuit according to claim 9, wherein the phase rotation adjustment part rotates the phase of the symbol set of the received data modulated by the modulation scheme, 8QAM, which has the phase rotated in the received symbol phase rotation part to the first quadrant of the constellation mapping diagram.

12. The likelihood generation circuit according to claim 10, wherein the phase rotation adjustment part rotates the phase of the symbol set of the received data modulated by the modulation scheme, 8QAM, which has the phase rotated in the received symbol phase rotation part to the first quadrant of the constellation mapping diagram.

13. A likelihood generation method for generating a likelihood of a received symbol of received data modulated by modulation schemes, QPSK and 8QAM, comprising:

Assigning, with a circuit, one bit out of three bits of the modulation scheme, 8QAM, depending on whether a symbol is on an inner circle or an outer circle of a constellation mapping diagram, and assigning remaining two bits to one of neighboring symbols obtained by rotating bit napping assigned to the outer circle by ±45 degrees;

generating, with the circuit and by QPSK likelihood generation, a likelihood of the received symbol of the received data modulated by the modulation scheme, QPSK, and a likelihood for the two bits assigned to the outer circle of the symbol set of the received data modulated by the modulation scheme, 8QAM, and processed by the phase rotation; and moving, with the circuit, the symbol set modulated by the modulation scheme, 8QAM, and processed by the phase rotation to symbol mapping positions for the modulation scheme, QPSK, to thereby generate, by the QPSK likelihood generation, the likelihood for the bit representing whether the received symbol is on the inner circle or the outer circle of the symbol set modulated by the modulation scheme, 8QAM.

* * * * *